United States Patent
Shiraishi et al.

(10) Patent No.: US 6,392,615 B1
(45) Date of Patent: May 21, 2002

(54) DRIVE APPARATUS AND METHOD OF LIGHT EMISSION ELEMENT ARRAY

(75) Inventors: Mitsuo Shiraishi, Shizuoka-ken; Toshiyuki Sekiya, Mishima, both of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/218,629

(22) Filed: Dec. 22, 1998

(30) Foreign Application Priority Data

Dec. 29, 1997 (JP) .............................................. 9-369141

(51) Int. Cl.$^7$ ................................................ G09G 3/28
(52) U.S. Cl. ............................. 345/60; 345/61; 345/39; 345/44; 345/83; 345/76; 345/183; 257/88; 257/113; 340/782
(58) Field of Search ............................... 345/60, 61, 82, 345/76, 44, 183, 39, 83; 257/113, 88; 340/782

(56) References Cited

U.S. PATENT DOCUMENTS

| | | | |
|---|---|---|---|
| 5,656,928 A | | 8/1997 | Suzuki et al. ............... 324/71.1 |
| 5,814,841 A | * | 9/1998 | Kusuda et al. ................. 345/82 |
| 6,002,420 A | * | 12/1999 | Tanioka et al. .............. 347/237 |
| 5,451,977 A | * | 8/2000 | Kusuda et al. ................. 345/44 |
| 6,064,158 A | * | 8/2000 | Kishita et al. ................. 345/76 |
| 6,108,018 A | * | 8/2000 | Narita et al. ................... 345/82 |

FOREIGN PATENT DOCUMENTS

| | | | |
|---|---|---|---|
| EP | 08008164 | 1/1996 | ........... H01L/33/00 |
| EP | 07225535 | 3/1997 | ........... H01L/33/00 |
| EP | 08059662 | 9/1997 | |
| JP | 1238962 | 9/1989 | ............... B41J/3/21 |
| JP | 2208067 | 8/1990 | ............... B41J/2/45 |
| JP | 2212170 | 8/1990 | ............... B41J/2/45 |
| JP | 3020457 | 1/1991 | ........... C23C/14/08 |
| JP | 3194978 | 8/1991 | ........... H01L/33/00 |
| JP | 4005872 | 1/1992 | ........... H01L/33/00 |
| JP | 4023367 | 1/1992 | ........... H01L/33/00 |
| JP | 4296579 | 10/1992 | ............... B41J/2/44 |
| JP | 5-84971 | 4/1993 | |
| JP | 5084971 | 4/1993 | ............... B41J/2/44 |
| JP | 8-179716 | 7/1996 | |

* cited by examiner

*Primary Examiner*—Richard Hjerpe
*Assistant Examiner*—Ali Zamani
(74) *Attorney, Agent, or Firm*—Fitzpatrick, Cella, Harper & Scinto

(57) ABSTRACT

In a drive apparatus of a self-scanning type light emission element array, a first bit light emission thyristor is surely set into an ON state, thereby stabilizing shift of a light emitting operation from the first bit light emission thyristor. In the light emission element array drive apparatus which drives a light emission element array having plural light emission thyristors arranged in array and plural shift thyristors arranged in array (each gate of shift thyristors is connected to each gate of light emission thyristors), the apparatus comprises: a generation unit for generating a shift signal to sequentially shift ON states of the shift thyristors; and a generation unit for generating a start signal to start drive of the light emission element array, wherein a gate voltage of the first light emission thyristor is supplied according to the start signal without setting the first shift thyristor into an ON state according to the shift signal.

9 Claims, 5 Drawing Sheets

DRIVE APPARATUS AND METHOD OF LIGHT EMISSION ELEMENT ARRAY

BACKGROUND OF THE INVENTION

1. Field of the Invention

The present invention relates to light emission element array drive apparatus and method for sequentially setting at least one or more light emission thyristor groups arranged in array, into a lighting state.

2. Related Background Art

Conventionally, a self-scanning type light emission element array (SLED) has been disclosed in Japanese Patent Application Laid-Open Nos. 1-238962, 2-208067, 2-212170, 3-20457, 3-194978, 4-5872, 4-23367, 4-296579 and 5-84971; "Proposal of Light Emission Element Array For Optical Printer Integrating Drive Circuits" JAPAN HARD COPY, 1991 (A-17); "Proposal Of Self-Scanning Type Light Emission Element (SLED) Using PNPN Thyristor Structure" THE INSTITUTE OF ELECTRONICS, INFORMATION AND COMMUNICATION ENGINEERS, Mar. 5, 1991; and the like. Such the SLED has been widely noticed as a recording light emission element.

FIG. 1 shows an example of a SLED 100 as a light emission element array. In the conventional art, FIG. 2 is a timing chart of various control signals externally transmitted to the SLED 100 to control the SLED 100 shown in FIG. 1, and indicates an example of a case where all the light emission elements are driven.

In FIG. 1, a VGA 101 corresponding to a power supply voltage of the SLED 100 is connected to diodes 141, 142, 143, 144 and 145. These diodes 141, 142, 143, 144 and 145 are cascade connected to a start pulse φS 145 respectively through resistors 102, 103, 104, 105 and 106. As shown in FIG. 1, the SLED 100 is composed of a group in which shift thyristors S1', S2', S3', S4' and S5' are arranged in array as control elements, a group in which light emission thyristors S1, S2, S3, S4 and S5 are arranged in array as light emission elements, and the like. Gate signals of the light emission thyristors and the shift thyristors are connected to each other. For example, the gate signal of the first light emission thyristor S1 is connected to the gate signal of the first shift thyristor S1', and further connected to a signal input section Va to which the start pulse φS 145 is transmitted. The gate signal of the second light emission thyristor S2 is connected to the gate signal of the second shift thyristor S2', and further connected to a cathode Vb of the diode 141 which is connected to the terminal Va to which the start pulse φS 145 is transmitted. The gate signal of the third light emission thyristor S3 is connected to the gate signal of the third shift thyristor S3', and further connected to a cathode Vc of the diode 142. Similarly, the gate signal of the fifth light emission thyristor S5 is connected to the gate signal of the fifth shift thyristor S5', and further connected to a cathode Ve of the diode 144.

Hereinafter, a driving method of the SLED 100 will be described with reference to the timing chart shown in FIG. 2.

In FIG. 2, initially, voltage of the start pulse φS 145 is varied from 0V to 5V. By varying the voltage of the start pulse φS 145 to 5V, a voltage of the Va becomes 5.0V, a voltage of the Vb becomes 3.6V (forward direction voltage down is 1.4V), a voltage of the Vc becomes 2.2V, a voltage of the Vd becomes 0.8V, voltages of the Ve and the following become 0. V. Then, voltage of the gate signals of the shift thyristors S1' and S2' are varied from 0V to 5.0V and 3.6V respectively. In this state, by varying voltage of a shift pulse φ1 135 from 5V to 0V, potentials of anode, cathode and gate of the shift thyristor S1' become 5V, 0V and 3.6V respectively. Thus, the thyristor becomes an ON condition, whereby the shift thyristor S1' becomes an ON state. In this state, even if the voltage of the start pulse φS 145 is set at 0V, since the shift thyristor S1' is in the ON state, the voltage of the Va becomes 5V (e.g., 4.8V in FIG. 2). This is because the pulse is applied through the resistor 102, concerning the start pulse φS 145, and the potential difference between the anode and gate becomes almost zero upon setting the thyristor into an ON state. Therefore, even if the voltage of the start pulse φS 145 is set at 0V, the ON state of the first shift thyristor S1' is maintained and a first shifting operation terminates. In this state, if voltage of a light emission thyristor drive clock φI 110 is varied from 5V to 0V, since the light emission thyristor S1 comes to have the same condition as that in which the shift thyristor S1' becomes the ON state, the light emission thyristor S1 becomes an ON state and the first light emission thyristor S1 is lighted. At the first light emission thyristor S1, the potential difference between an anode and a cathode of the light emission thyristor S1 becomes zero by returning the voltage of the light emission thyristor drive clock φI 110 to 5V. Thus, since a minimum maintaining current for the light emission thyristor S1 can not be flowed, the light emission thyristor S1 becomes an OFF state, thereby lighting off the thyristor S1.

Subsequently, transfer of the ON state of the thyristor from the shift thyristor S1' to the shift thyristor S2' will be explained. Even if the light emission thyristor S1 becomes the OFF state, the voltage of the shift pulse φ1 135 is still 0V. Thus, also the shift thyristor S1' is still in the ON state, the gate voltage Va of the shift thyristor S1' is 5V (e.g., 4.8V in FIG. 2) and the voltage of the Vb is 3.6V. In this state, by varying voltage of a shift pulse φ2 120 from 5V to 0V, anode, cathode and gate voltages of the shift thyristor S2' become 5V, 0V and 3.6V respectively, whereby the shift thyristor S2' becomes an ON state. After the shift thyristor S2' becomes the ON state, by varying the voltage of the shift pulse φ1 135 from 0V to 5V, the shift thyristor S1' becomes an OFF state in the manner similar to that the light emission thyristor S1 became the OFF state. Thus, the ON state of the shift thyristor is transferred from the shift thyristor S1' to the shift thyristor S2'. Then, the light emission thyristor S2 can be selectively lighted by varying the voltage of the light emission thyristor drive clock φI 110 from 5V to 0V. Hereinafter, the reason of lighting only the light emission thyristor of which corresponding shift thyristor is in the ON state will be explained. Since gate voltages of thyristors other than the both-side thyristors (e.g., S1' and S3') of the ON state thyristor (e.g., S2') are 0V, the thyristors do not become the ON state. Also, as to the both-side shift thyristors (e.g., S1' and S3'), since potential of the drive clock φI 110 becomes 3.6V (forward direction voltage down at each light emission thyristor) due to the fact that the shift thyristor (e.g., S2') becomes the ON state, the both-side thyristors (e.g., S1' and S3') become such a state as the potential difference between the gate and the cathode is minimized and a minimum maintaining current for the thyristors can not be flowed. Therefore, it is impossible to set the both-side shift thyristors (e.g., S1' and S3') into an ON state.

As described above, conventionally, when the voltage 5V of the start pulse φS 145 is supplied, the first bit shift thyristor S1' is set into an ON state by varying the voltage of the shift pulse φ1 135 (acting as drive signal for odd-number shift thyristors S1' and S3') to 0V, and the gate voltage of the light emission thyristor S1 is maintained at 5V. Thereafter, the voltage of the light emission thyristor drive clock φI 110 for the light emission thyristor S1 is set at 0V, thereby lighting the light emission thyristor S1.

However, shift speed of sequentially shifting the gate voltage of the shift thyristor being a characteristic of the SLED is changed according to a manufacturing condition of semi-conductive wafers which form the SLED. Therefore, in a case where shifting and light emitting operations are performed at high speed, the shifting of the gate voltage of the shift thyristor is sometimes delayed. That is, there occurs such a phenomenon as the light emission thyristor intended to be lighted is not lighted but another thyristor of which gate voltage is in a most high level is lighted. As a result, the shifting of light emitting operation becomes unstable. Especially, when the first bit light emission thyristor is lighted, the gate voltages of the shift thyristors other than the first bit tend to become such a state as the voltage can not completely become 0V because of high speed shifting. In this state, in a case where the voltage of the start pulse φS 145 is set at 5V and the first bit shift thyristor is set into an ON state, if the gate voltage of another shift thyristor is higher than that of the first bit shift thyristor, the first bit shift thyristor does not become an ON state but the shift thyristor of which gate voltage is high becomes an ON state. Therefore, if the voltage of the light emission thyristor drive clock φI 110 is set at 0V intending to set the first bit light emission thyristor into an ON state, the light emission thyristor, of which bit corresponds to that of the above another shift thyristor of which gate voltage is high becomes ON state, is to be lighted. As a result, there occurs such a problem as a lighting state of the first bit can not be sequentially shifted to other bits.

SUMMARY OF THE INVENTION

The present invention has been made to solve the above-described problem, and an object thereof is to provide light emission element array drive apparatus and method for surely setting a first bit light emission thyristor into an ON state at first, thereby stabilizing a shift of light emitting operation from the first bit light emission thyristor.

In order to solve the above problem, the present invention provides a light emission element array drive apparatus which drives a light emission element array having plural light emission thyristors arranged in array and plural shift thyristors arranged in array, each gate of the shift thyristors being connected to each gate of the light emission thyristors, the apparatus comprising:

a generation unit for generating a shift signal to sequentially shift ON states of the shift thyristors; and a generation unit for generating a start signal to start drive of the light emission element array, wherein a gate voltage of the first light emission thyristor is supplied according to the start signal without setting the first shift thyristor into an ON state according to the shift signal.

Further, the present invention provides a light emission element array drive apparatus which drives a light emission element array having plural light emission elements (arranged in array) and plural control elements (arranged in array, and each element supplies an ON state to corresponding light emission element), the apparatus comprising:

a generation unit for generating a shift signal to sequentially shift ON states of the control elements; and a generation unit for generating a start signal to start drive of the light emission element array, wherein the first light emission element is set into an ON state according to the start signal.

DETAILED DESCRIPTION OF THE PREFERRED EMBODIMENT

The embodiment of the present invention will be described with reference to the accompanying drawings.

Figure 3:
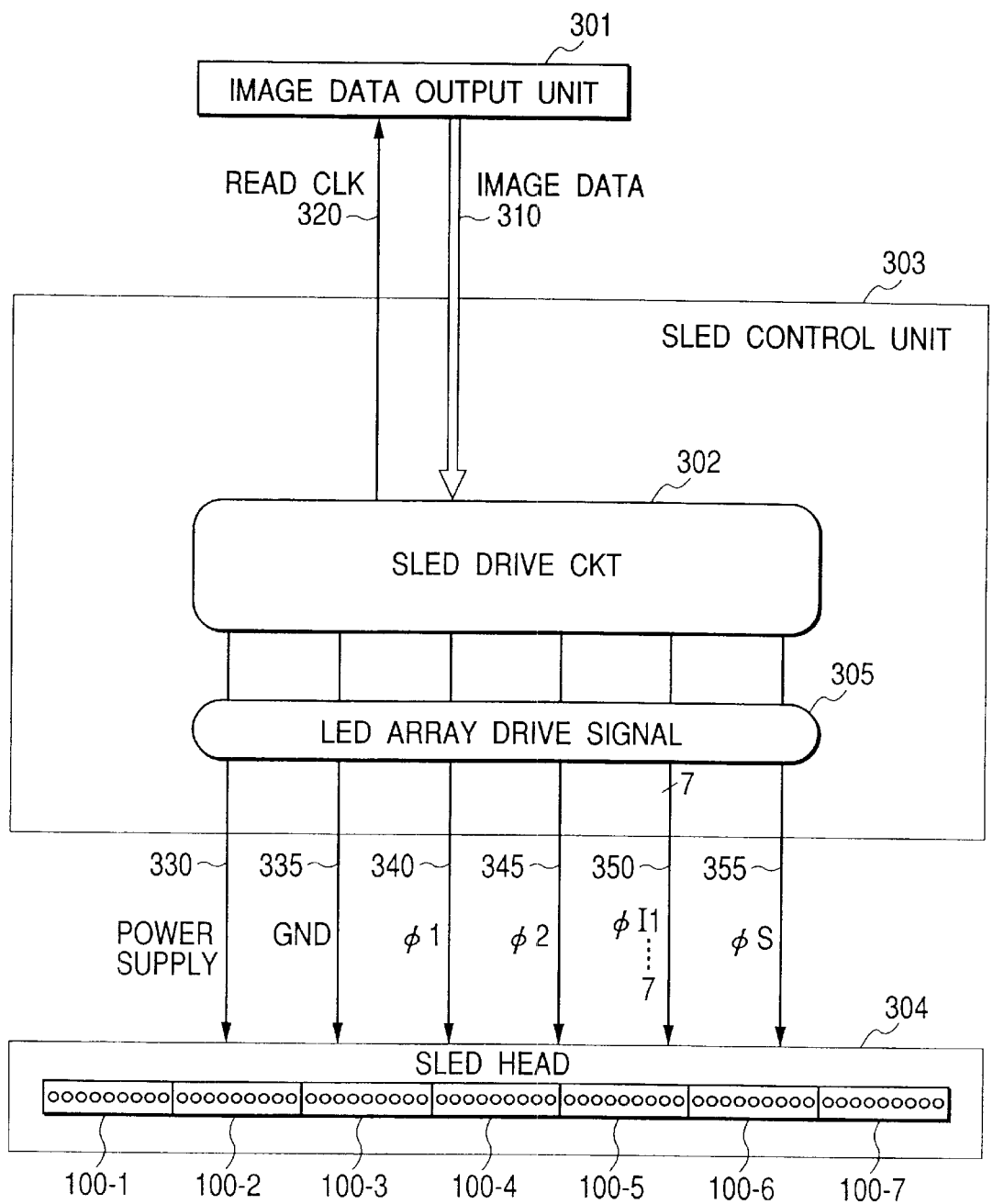
FIG. 3 is a block diagram showing an example of a basic structure of a SLED drive control apparatus in an embodiment of the present invention.
Figure 4:
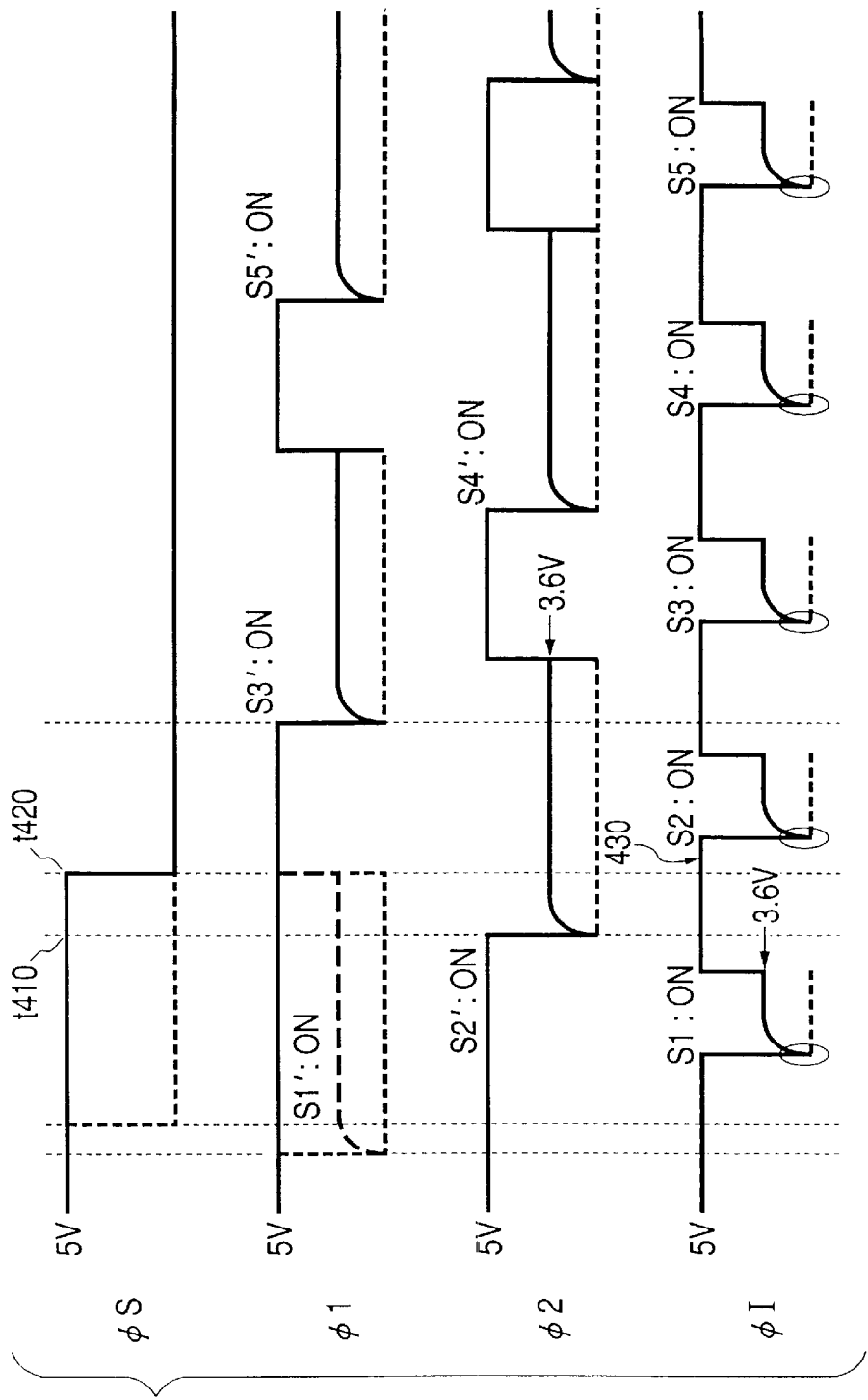
FIG. 4 is a timing chart showing control signals and timing thereof for controlling the SLED in the embodiment of the present invention.

FIG. 3 shows a structure of a drive apparatus for driving a SLED as a light emission element array. FIG. 4 is a timing chart for explaining an operation indicated in FIG. 3.

Figure 1:
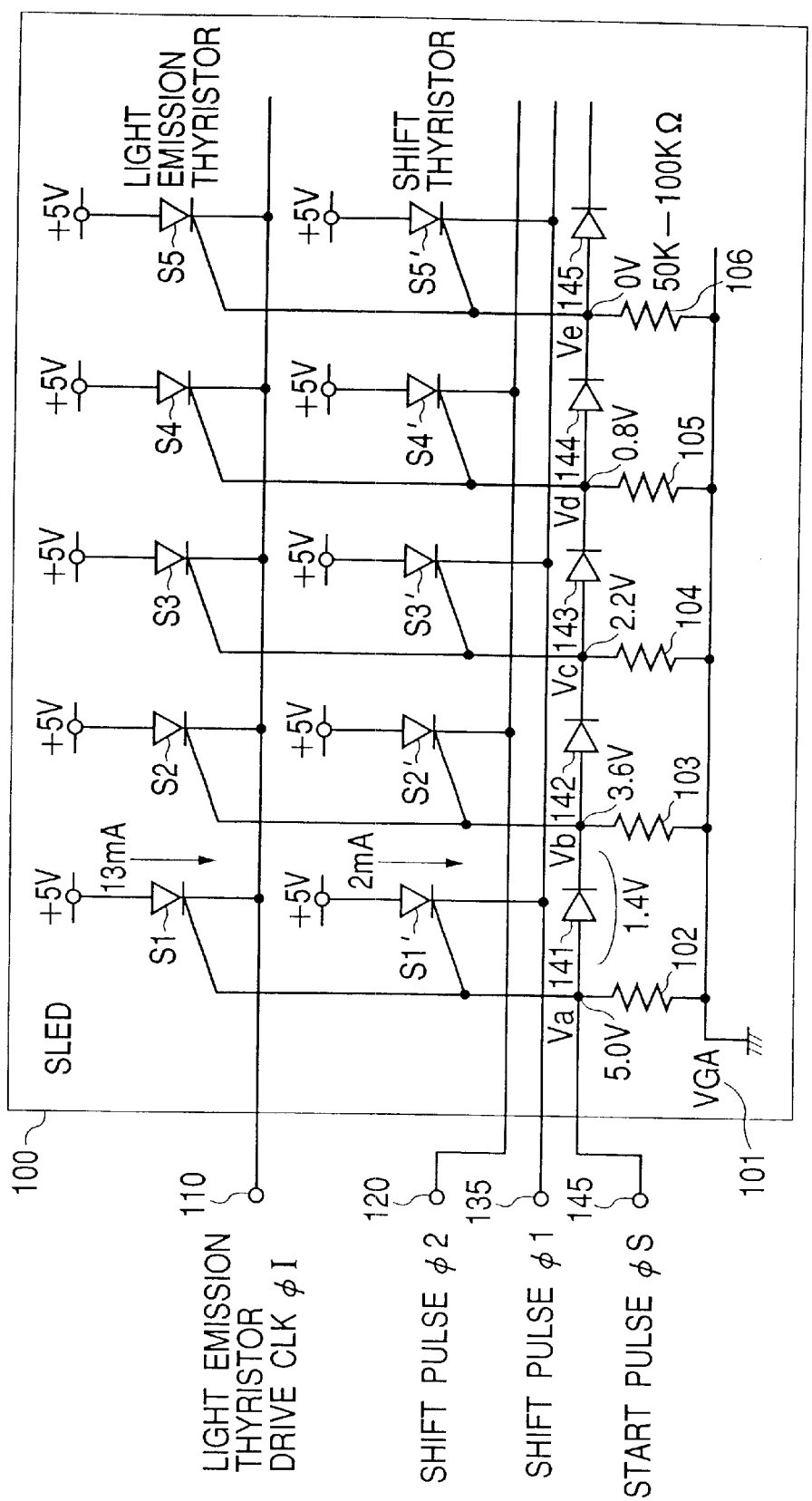
FIG. 1 is a diagram showing an example of a basic structure of a SLED.
Figure 2:
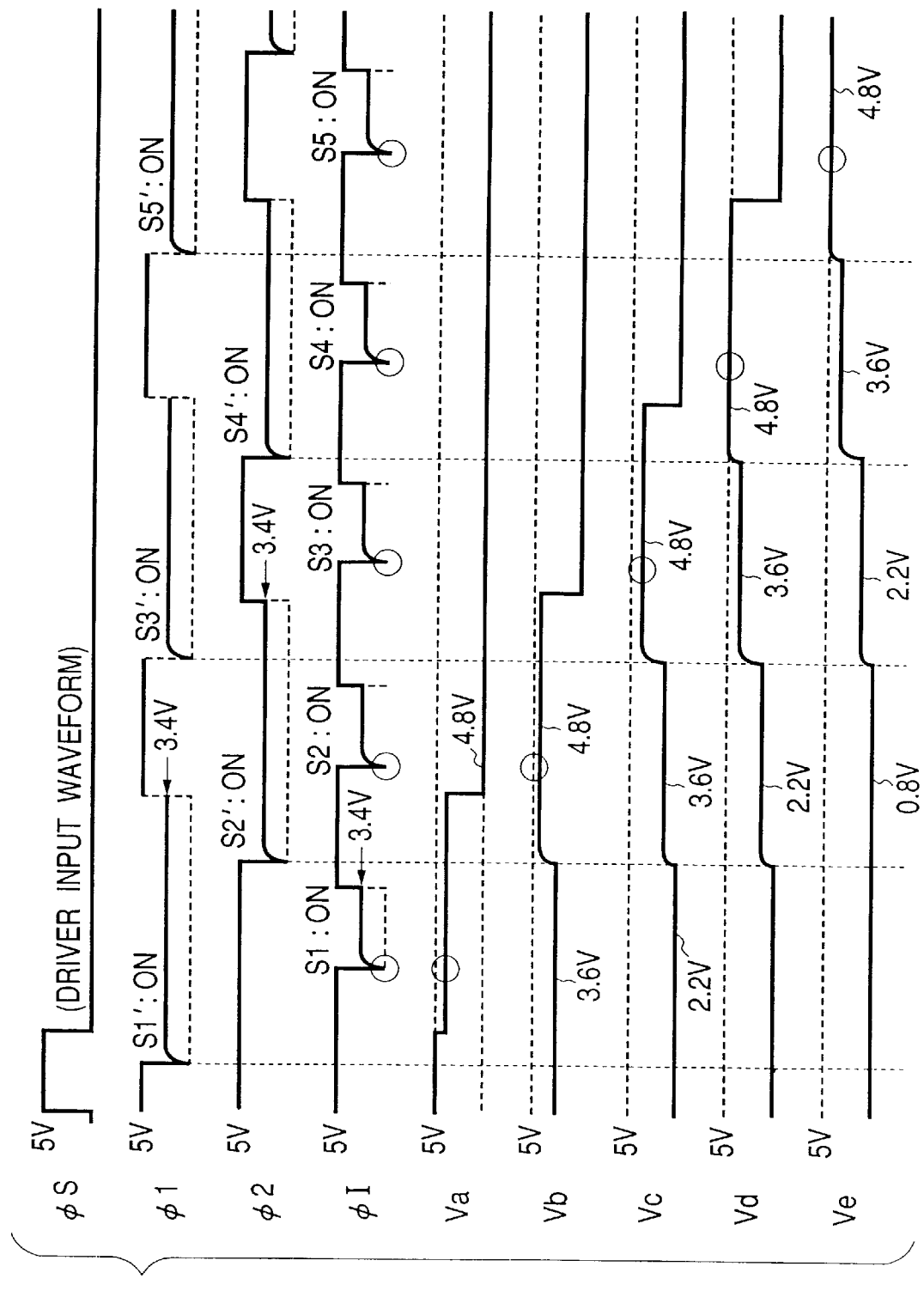
FIG. 2 is a timing chart showing conventional control signals and timing thereof.
Figure 5:
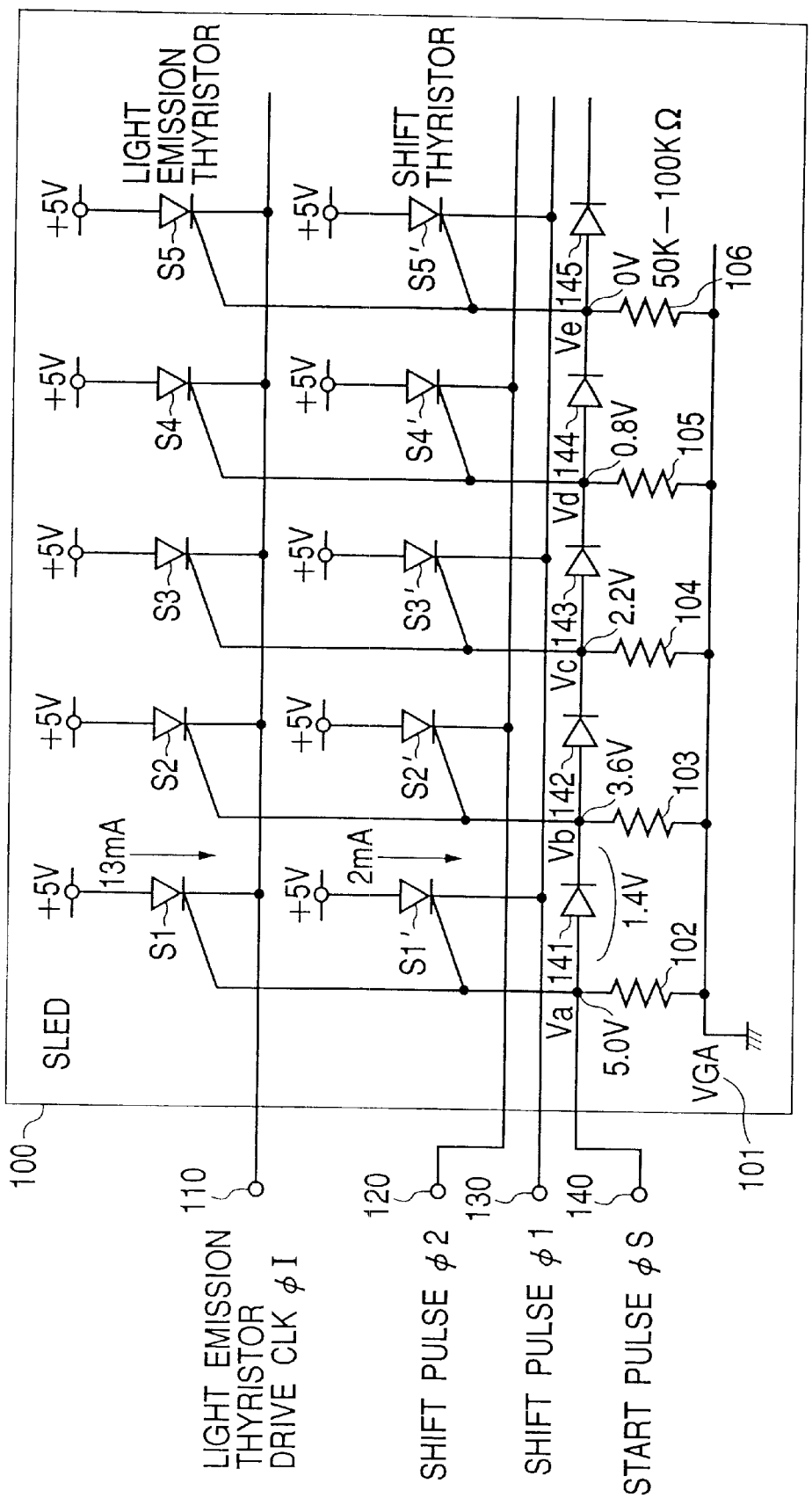
FIG. 5 is a diagram showing an example of a structure of the SLED in the embodiment of the present invention.

Although an inner structure of the SLED is same as that of the conventional one shown in FIG. 1, the structure will be shown in FIG. 5 to make it sure.

In FIG. 5, a VGA 101 corresponds to a power supply voltage of a SLED 100 is connected to diodes 141, 142, 143, 144 and 145 which are cascade connected to a start pulse φS 140 through resistors 102, 103, 104, 105 and 106. As shown in FIG. 5, the SLED 100 is composed of a group in which shift thyristors S1', S2', S3' S4' and S5' are arranged in array as control elements, a group in which light emission thyristors S1, S2, S3, S4 and S5 are arranged in array as light emission elements, and the like. Gate signals of the light emission thyristors and gate signals of the shift thyristors are connected each other. For example, the gate signal of the first light emission thyristor S1 is connected to the gate signal of the first shift thyristor S1', and further connected to a signal input section Va to which the start pulse φS 140 is transmitted. The gate signal of the second light emission thyristor S2 is connected to the gate signal of the second shift thyristor S2', and further connected to a cathode Vb of the diode 141 which is connected to the terminal Va to which the start pulse φS 140 is transmitted. The gate signal of the third light emission thyristor S3 is connected to the gate signal of the third shift thyristor S3', and further connected to a cathode Vc of the diode 142. Similarly, the gate signal of the fifth light emission thyristor S5 is connected to the gate signal of the fifth shift thyristor S5', and further connected to a cathode Ve of the diode 144.

It should be noted that, in this embodiment, since a start signal and a shift signal have different functions from those of conventional signals, reference numerals thereof are made different from those in FIG. 1, but others parts in FIG. 5 are added with identical numerals and symbols as those in FIG. 1.

As shown in FIG. 3, the drive apparatus is composed of an image data output unit 301 for outputting image data used to form a permanent visible image on a recording medium in an electrophotographic record system, a SLED control unit 303 having a SLED drive circuit 302 for outputting a READ clock 320, which is used for reading out image data 310, to the image data output unit 301 and inputting the image data 310 output from the image data output unit 301 to cause to generate a SLED (LED array) drive signal 305 and a SLED head 304 having the shift thyristors of a SLED to sequentially set a light emitting state and the light emission thyristors. In the SLED head 304, plural pieces of the SLED 100 already explained in the background art are arranged in array as indicated by numerals 100-1 to 100-7 shown in FIG. 3. The SLED (LED array) drive signal 305 contains a signal from a power supply 330, a signal to a GND 335, a shift clock φ1 340, a shift clock φ2 345, a light emission thyristor drive clock φI 350 and a start pulse φS 355. Light emission thyristor drive clocks φI 1 to φI 7, which are parallel signals of 7 bits of which each bit signal responds to the SLED 100-1 to 100-7, are used to selectively light or turn on light emission elements in each of the SLEDs. In a case where the number of SLEDs is large, since the bit width of the light emission thyristor drive clock also becomes large, it is desirable to reduce the number of signal lines by properly executing a coding process.

Since other signals such as the signal from the power supply 330, the signal to the GND 335, the shift clock φ1 340, the shift clock φ2 345 and the start pulse φS 355 are common to each of SLEDs, the number of signal line of the above each signal may be defined as one.

FIG. 4 is a timing chart of the shift pulse φ1, the shift pulse φ2, the start pulse φS and the light emission thyristor drive clock φI which is formed by the image data 310 and a light emission clock (not shown). The SLED drive signal 305 is output to the SLED head 304 from the SLED control unit 303 by the SLED drive circuit 302 shown in FIG. 3.

In FIG. 4, broken line portions in waveforms of the pulse φS and the pulse φ1 indicate conventional SLED drive signal waveforms, and signal waveforms in this embodiment are indicated by solid lines. In the present invention, an applying time of the start pulse φS 140 by the voltage of 5V is extended until such a time as the ON state of the conventional first bit shift thyristor S1' terminates (i.e., time t420), instead of not setting the first bit shift thyristor S1' into an ON state. Thus, a gate voltage of the first bit light emission thyristor S1 is supplied according to the start pulse φS 140 to maintain the ON state of the light emission thyristor S1. Since the first bit shift thyristor S1' is not set into an ON state, the shift thyristor (except for first bit) of which gate voltage does not yet become 0V completely is not set into an ON state. Also, a time until the gate voltage of the shift thyristor other than the first bit (e.g., S2') becomes 0V (time from t410 to t420) can be ensured. The gate voltage of the first bit shift thyristor S1' is maintained to 5V according to the start pulse φS 140. The gate voltage of the first bit transfer thyristor S1' is maintained at 5V by the start pulse φS 140. Thus, the first bit light emission thyristor S1 is surely set into an ON state by supplying the gate voltage of the first bit light emission thyristor S1 with use of the start pulse φS 140 of 5V, thereby stabilizing a bit shifting operation from the first bit light emission thyristor S1 to the fifth bit light emission thyristor S5. When the first bit light emission thyristor S1 is in an ON state, the light emission thyristor S1 can be selectively lighted by setting the drive clock φI into an ON state.

Since the time until the gate voltage of the above shift thyristor (e.g., S2') becomes 0V may be a period from the time t410 to the time t420 shown in FIG. 4, in this case, a time when the light emission thyristor S2 becomes an ON state can be extended to a time t430.

A shifting operation to the shift thyristors following the first bit shift thyristor is performed according to the shift signal in the same manner as that in the conventional art.

Also, a light emitting operation to each of the light emission thyristors is performed according to the drive clock φI in the same manner as that in the conventional art, thereby enabling to selectively light each of the light emission thyristors.

In the above description, the five pairs of thyristors are shown in FIG. 5 to simplify the description. However, hundreds pairs of thyristors may be actually arranged.

As described above, according to the LED array drive apparatus in the present invention, the applying time of the start pulse φS 140 by the voltage of 5V is extended until such the time as the ON state of the conventional first bit shift thyristor S1? terminates, instead of not setting the first bit shift thyristor S1' into the ON state. Thus, the gate voltage of the first bit light emission thyristor S1 is supplied according to the start pulse φS 140 to maintain the ON state of the light emission thyristor S1, so that the first bit light emission thyristor S1 is surely set into the ON state. As a result, the shifting operation of the light emission element from the first bit can be stabilized.

As above, the present invention has been described with reference to the preferred embodiment. However, the present invention is not limited to this. That is, various modifications and applications are possible within the scope of the appended claims.

What is claimed is:

1. A light emission element array drive apparatus which drives a light emission element array having plural light emission thyristors arranged in an array and plural shift thyristors arranged in an array, each gate of the shift thyristors being connected to a gate of a corresponding light emission thyristor, said apparatus comprising:

input means for inputting a first shift signal and a second shift signal to sequentially shift ON states of the shift thyristors repeatedly via a first line and a second line, wherein a gate voltage of a first light emission thyristor is supplied by a start signal, inputted via a third line which differs from said first line and said second line, to begin an ON state.

2. An apparatus according to claim 1, wherein a start signal for supplying the gate voltage of the first light emission thyristor is maintained at high potential until the second shift thyristor becomes an ON state and is set at low potential before the second light emission thyristor becomes an ON state.

3. An apparatus according to claim 1, wherein the array of shift thyristors includes odd-number shift thyristors and even-number shift thyristors, the shift thyristors each have at least one cathode, and the shift signal comprises a first shift signal transmitted to each of the cathodes of the odd-number shift thyristors and a second shift signal transmitted to each of the cathodes of the even-number shift thyristors.

4. An apparatus according to claim 1, wherein each thyristor has at least one anode and a power supply voltage is supplied to each of the anodes of the light emission thyristors and the shift thyristors.

5. An apparatus according to claim 1, wherein the apparatus has plural diodes cascade connected, an anode of each diode is connected to gates of shift thyristor and of a light emission thyristor and is also connected to a power supply through a resistor, and the start signal is supplied to the anode of a first diode in the plural diodes.

6. An apparatus according to claim 1, further comprising generation means for generating a drive signal to selectively light the light emission thyristors.

7. A light emission element array drive method for driving a light emission element array having plural light emission thyristors arranged in an array and plural shift thyristors arranged in an array, each gate of each of the shift thyristors being connected to a gate of a corresponding light emission thyristor, said method comprising:

an input step of inputting a first shift signal and a second shift signal to sequentially shift ON states of the shift thyristors repeatedly via a first line and a second line, wherein a gate voltage of a first light emission thyristor connected to the first shift thyristor is supplied by a start signal, inputted via a third line which differs from said first line and said second line, to begin an ON state.

8. A method according to claim 7, wherein a start pulse for supplying the gate voltage of the first light emission thyristor is maintained at high potential until the second shift thyristor becomes an ON state and is set at low potential before the second light emission thyristor becomes an ON state.

9. A method according to claim 7, wherein the array of shift thyristors includes odd-number shift thyristors and even-number shift thyristors, the shift thyristors each have at least one cathode, and in said input step a first shift signal transmitted to each of the cathodes of the odd-number shift thyristors and a second shift signal transmitted to each of the cathodes of the even-number shift thyristors are generated.

* * * * *

UNITED STATES PATENT AND TRADEMARK OFFICE
CERTIFICATE OF CORRECTION

PATENT NO.       : 6,392,615 B1
DATED            : May 21, 2002
INVENTOR(S)      : Mitsuo Shiraishi et al.

It is certified that error appears in the above-identified patent and that said Letters Patent is hereby corrected as shown below:

Title page,
Item [56], References Cited,
"JP 1238962" should read -- JP 1-238962 --.
"JP 2208067" should read -- JP 2-208067 --.
"JP 2212170" should read -- JP 2-212170 --.
"JP 3020457" should read -- JP 3-20457 --.
"JP 3194978" should read -- JP 3-194978 --.
"JP 4005872" should read -- JP 4-5872 --.
"JP 4023367" should read -- JP 4-23367 --.
"JP 4296579" should read -- JP 4-296579 --.
"JP 5-84971     4/1993
 JP 5084971     4/1993 ......... B41J/2/44" should read
-- JP 5-84971 ......... B41J/2/44 --.

Column 1,
Line 22, "Such the" should read -- Such a --.

Column 3,
Line 13, "of which" should read -- whose --.
Line 25, "of which" should read -- whose --.
Line 29, "bit" should read -- the bit --.
Line 30, "of which" should read -- whose --

Column 4,
Line 39, "each" should read -- to each --.
Line 57, "others" should read -- other --.

Column 5,
Line 2, "to generate" should read -- the generation of --.
Line 22, "line" should read -- lines --.
Line 42, "of which" should read -- whose --.

Column 6,
Line 12, "S1?" should read -- S1' --.
Line 58, "of" (first occurrence) should read -- of a --.

UNITED STATES PATENT AND TRADEMARK OFFICE
CERTIFICATE OF CORRECTION

PATENT NO. : 6,392,615 B1
DATED : May 21, 2002
INVENTOR(S) : Mitsuo Shiraishi et al.

It is certified that error appears in the above-identified patent and that said Letters Patent is hereby corrected as shown below:

<u>Column 7,</u>
Line 8, "the" should read -- a --.

Signed and Sealed this

Twenty-first Day of January, 2003

JAMES E. ROGAN
*Director of the United States Patent and Trademark Office*